(12) United States Patent
Yasuda et al.

(10) Patent No.: US 7,038,144 B2
(45) Date of Patent: May 2, 2006

(54) ELECTRONIC COMPONENT AND METHOD AND STRUCTURE FOR MOUNTING SEMICONDUCTOR DEVICE

(75) Inventors: Masao Yasuda, Kashihara (JP); Masato Sumikawa, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 489 days.

(21) Appl. No.: 10/040,804

(22) Filed: Nov. 8, 2001

(65) Prior Publication Data

US 2002/0100610 A1 Aug. 1, 2002

(30) Foreign Application Priority Data

Nov. 8, 2000 (JP) ........................................ 2000-339954

(51) Int. Cl.
*H05K 1/16* (2006.01)

(52) U.S. Cl. .............................. 174/260; 29/840; 29/843

(58) Field of Classification Search ......... 174/260–266; 439/65–75; 29/832, 840, 843
See application file for complete search history.

(56) References Cited

U.S. PATENT DOCUMENTS

| | | | | |
|---|---|---|---|---|
| 5,001,302 A | | 3/1991 | Atsumi ........................... 174/94 |
| 5,147,084 A | * | 9/1992 | Behun et al. .................. 174/259 |
| 5,598,036 A | * | 1/1997 | Ho ................................ 257/738 |
| 5,657,207 A | * | 8/1997 | Schreiber et al. ............. 174/254 |
| 5,744,759 A | * | 4/1998 | Ameen et al. ................. 174/260 |
| 5,790,377 A | * | 8/1998 | Schreiber et al. ............. 257/737 |
| 5,956,235 A | * | 9/1999 | Kresge et al. ................. 361/774 |
| 5,956,605 A | * | 9/1999 | Akram et al. .............. 228/180.22 |
| 6,059,579 A | * | 5/2000 | Kresge et al. .................. 439/66 |
| 6,172,879 B1 | * | 1/2001 | Cilia et al. .................... 174/260 |
| 6,303,408 B1 | * | 10/2001 | Smith ........................... 438/106 |
| 6,337,445 B1 | * | 1/2002 | Abbott et al. ................. 174/257 |
| 6,418,029 B1 | * | 7/2002 | McKee et al. ................ 174/260 |

FOREIGN PATENT DOCUMENTS

| | | |
|---|---|---|
| EP | 0 660 405 A2 | 6/1995 |
| JP | 62-266842 | 11/1987 |
| JP | 04-269834 | 9/1992 |
| JP | 7-45664 | 2/1995 |
| JP | 8-213400 | 8/1996 |
| JP | 09-293753 | 11/1997 |
| JP | 10-173006 | 6/1998 |
| WO | WO 97/35343 | 9/1997 |

OTHER PUBLICATIONS

Communication from EPO: Partial European Search Report for application No. EP 01 12 6395 dated Aug. 8, 2002 (5 pp.).
Japanese Patent Office First Office Action dated Dec. 2, 2003, (3 pp.) for application No. 2000–339954 and English Translation (3 pp).

* cited by examiner

*Primary Examiner*—Kamand Cuneo
*Assistant Examiner*—Jeremy Norris
(74) *Attorney, Agent, or Firm*—Edwards & Angell, LLP; David G. Conlin; George W. Hartnell, III

(57) ABSTRACT

An electronic component having an electrode structure to increase an allowance positional deviation in a mounting process as well as a method and a structure for mounting a semiconductor device are provided. The semiconductor device includes, on electrodes, connection materials connecting the semiconductor device and a substrate. The connection materials include a composite connection material formed of a core and a conductor covering the core, the core having an a low modulus of elasticity at room temperature smaller than that of the conductor at room temperature, and a single-layer connection material formed of a conductor.

4 Claims, 14 Drawing Sheets

APPLY BY PRINTING OR DISPENSER

ELECTRONIC COMPONENT AND METHOD AND STRUCTURE FOR MOUNTING SEMICONDUCTOR DEVICE

BACKGROUND OF THE INVENTION

1. Field of the Invention

The present invention relates to electronic components such as semiconductor device and substrate that can densely be mounted with a highly reliable connection and further relates to a method and a structure for mounting semiconductor devices.

2. Description of the Background Art

In recent years, with increasing requirements for reduction in size and weight of electronic equipment and devices represented by cellular phone and mobile data equipment, semiconductor devices have been reduced in size and increased in density. Mounting structures are accordingly proposed, with the purpose of achieving smaller size and higher density of semiconductor devices, such as bare-chip mounting structure having an LSI chip directly mounted on a circuit board as well as so-called chip size package (CSP) structure with the entire size reduced by forming a semiconductor device as close as possible in shape to an LSI chip. In order to accomplish such a high mounting-density, a structure is employed where connection materials are arranged on one side of a semiconductor device.

In the mounting structures as described above, there is a difference in thermal expansion coefficient between the bare chip or CSP and a circuit board on which the bare chip or CSP is mounted. In a mounting process, a thermal stress generated at the connecting portion therebetween causes a thermal strain. The thermal strain leads to metal fatigue of connection materials so that cracks are generated in the connection materials which are consequently broken, possibly resulting in a malfunction of electronic components. This problem is serious since it becomes difficult, with the reduction in size and weight as well as increase in integration and pin number of semiconductor devices, to provide a satisfactory structure for alleviating the thermal stress that is enough to prevent the connection materials from breaking.

FIG. 13 shows a conventional CSP mounting structure. Referring to FIG. 13, a semiconductor device 105 is connected to a substrate 106 via connection materials 113. When a thermal stress is repeatedly exerted on the mounting structure, a crack 130 is produced in connection material 113 at a site closer to an electrode of semiconductor device 105 as shown in an enlarged cross sectional view of FIG. 14. Referring to FIG. 14, crack 130 runs to cross connection material 113. In the structure having the substrate on which components are mounted with a good solder connection and an optimized electrode design, the crack appears in the electrode opening as shown in FIG. 14 resulting in rupture. In other wards, it is seen that the maximum stress concentration occurs in the electrode opening due to the repeated thermal stress after mounting, and consequently the crack is opened. It is noted that the electrode of the semiconductor device for which the connection material is provided is an external electrode and is herein referred to simply as "electrode." In some cases, a component consisting of a connection material and an electrode may be herein referred to as external electrode.

In order to address the problem discussed above, it is proposed in Japanese Patent Laying-Open No. 10-173006 to use a composite ball as a connection material between a semiconductor device and a substrate, the composite ball containing a resin ball with a low modulus of elasticity. The resin ball within the composite ball can alleviate the thermal stress caused by the difference of thermal expansion coefficient between the semiconductor device and the substrate, and accordingly enhance the reliability of the connecting portion.

The composite ball is also proposed in Japanese Patent Laying-Open No. 7-45664 disclosing that balls of different types are arranged in respective connection materials of external electrodes. The balls of different types can thus be arranged to remarkably decrease the number of processes such as soldering process. It is further proposed in Japanese Patent Laying-Open No. 8-213400 that a ball of a low modulus of elasticity is provided in a connection material of an external electrode. According to this; a force exerted on a connecting portion in a bonding process is absorbed by the ball of the low elastic modulus in the connection material of the external electrode to prevent a crack from opening in the connection material of the external electrode.

These methods are proposed for enhancing the reliability of the connecting portion in the mounting structure while they have a problem as described below. FIG. 15 is a cross sectional view of a conventional connecting portion of a mounting structure. Referring to FIG. 15, an electrode 104 of a semiconductor chip 105 is electrically connected to a connection terminal 107 of a circuit board 106 via a conductor 102 covering a resin ball 101. Short circuit between electrode 104 on semiconductor chip 105 and an adjacent electrode or the like is prevented by a protection film 125. With a similar purpose, a protection film 126 of circuit board 106 is provided. When this mounting structure is applied for use, a repeated thermal stress causes a crack 130 running along the interface between resin ball 101 and conductor 102 that constitute a composite connection material as shown in FIG. 16. In the mounting structure merely including the resin ball of a low modulus of elasticity in the connection material, the crack as shown in FIG. 16 is generated. It is confirmed through experiments by the inventors of the present invention that the lifetime of this structure is shorter than any structure without resin ball. In the mounting structure as shown in FIG. 16, the stress concentrates on a surface where different materials meet, namely on and around the interface between the resin ball of the low elastic modulus and the metal (conductor). The resin and metal are joined in this region which is accordingly mechanically weak. If the metal on the surface of the resin ball has a multi-layer structure, diffusion between the metal layers produces a brittle inter-metallic compound on the interface. Due to such a mechanically weak region, a crack is opened at an early stage.

As shown in FIG. 17, if an electrode on a substrate and the external electrode mentioned above are mounted without a sufficient alignment with each other, the semiconductor device and substrate are connected with a positional deviation with respect to each other. Consequently, resin ball 101 of the low elastic modulus in the connection material connecting electrodes 104 and 107 cannot be covered uniformly with metal (conductor) 102 as seen in the region indicated by D in FIG. 17. Then, if a certain force is exerted on the connection material, the stress concentrates on the thinnest portion of the conductor covering the resin ball and thus a crack is generated at an early stage. Here, it is supposed that a resin ball is used for an electrode of a CSP of 0.8 mm pitch which is mounted on a substrate. In this case, a crack is produced when the center of an electrode of a semiconductor device and that of an electrode of the substrate are deviated from each other by at least 100 µm, since the resin ball cannot be covered uniformly with the conductor. Consequently, a failure occurs at an early stage.

Moreover, if all connection materials for electrodes of the semiconductor device are composite connection materials each formed of a resin ball and a conductor, the semiconductor device could not be mounted on the substrate with a high precision, which leads to an inconvenience as described below. Specifically, the electrodes of the semiconductor device and those of the substrate are connected by the connection materials, and the amount of conductors around resin balls is insufficient so that there is an insufficient self-alignment effect which moves the electrode center of the semiconductor device to allow it to correspond to the electrode center of the substrate. This is because the self-alignment effect is produced from the surface tension or the like of the conductors. Accordingly, the early-stage crack mentioned above is likely to occur.

SUMMARY OF THE INVENTION

One object of the present invention is to provide an electronic component including a composite connection material containing a resin ball therein for improving connection reliability, the electronic component having an electrode structure to increase an allowable positional deviation in a mounting process, and further to provide a method and a structure for mounting a semiconductor device.

A semiconductor device according to the present invention is an electronic component including, on electrodes, a plurality of connection materials connected to another electronic component. The connection materials include a composite connection material formed of a core and a conductor covering the core, the core having an a low modulus of elasticity at room temperature smaller than an a modulus of elasticity of the conductor at room temperature, and include a single-layer connection material formed of a conductor.

When the composite and single-layer connection materials are arranged as connection materials of the electronic component, the electrodes of the semiconductor device (electronic component) can accurately be arranged on corresponding electrodes of a substrate by a self-alignment function which is mainly of the conductor of the single-layer connection material even if the electrodes of the semiconductor device (electronic component) and those of the substrate are not aligned in a mounting process of the electronic component in a mounting structure. Moreover, the smaller a low modulus of elasticity of the core in the composite connection material increases the deformability of the composite connection material. Therefore, it becomes unlikely that any crack is opened due to a repeated stress and thus the resistance to the repeated stress is enhanced. Then, composite connection materials can be arranged in an area where the stress concentrates so that the concentrated stress can be alleviated to prevent cracking.

Although the electronic component herein refers mainly to semiconductor device and substrate, the electronic component is not limited to the semiconductor device and substrate. A semiconductor device is a device including a semiconductor chip and accordingly, a mounting structure of a semiconductor device having been mounted on a substrate is also called semiconductor device. For the sake of convenience of description below, one electronic component is referred to as a semiconductor device and the other electronic component is referred to as a substrate.

For the electronic component according to the present invention, preferably the composite connection material is placed on an electrode among electrodes arranged in an electrode region of the electronic component, that electrode being located in an area where a relatively greater stress is likely to be exerted than a stress exerted on another area of the electrode region, and the single-layer connection material is placed on an electrode in that another area.

Such an arrangement can relieve the stress imposed on the connecting portion between the semiconductor device and substrate. Accordingly, the endurance in a heat cycle can be improved. Moreover, it is possible to obtain the self-alignment function chiefly from the single-layer connection material.

For the electronic component of the present invention, preferably the composite connection material is placed on an electrode in an area inside and along the perimeter of the electronic component and the single-layer connection material is placed on an electrode in an area other than that perimeter area, for example. In the mounting structure, it often occurs that an external stress is repeatedly exerted chiefly on the perimeter area of the semiconductor device (electronic component) to cause a crack in a connection material placed in the perimeter area. As discussed above, the composite connection material including a core made of an elastic body for example is placed in the perimeter area so as to provide the endurance to the repeated external stress. In addition, the self-alignment function is available chiefly from the surface tension of the single-layer connection material.

For the electronic component of the present invention, preferably the composite connection material is placed on an electrode among electrodes arranged in an electrode region of the electronic component, that electrode being located in a corner area of the electrode region, and the single-layer connection material is placed on an electrode located in an area other than the corner area.

In particular, the repeated stress remarkably concentrates at the corner area. Then, the composite connection material can be provided to the corner area to prevent cracks from occurring.

For the electronic component of the present invention, the ratio in number of the composite connection material to all connection materials may be from 10% to 90% for example.

If the ratio of the composite connection material is less than 10%, it is impossible to reduce the probability of occurrence of a crack in the single-layer connection material. If the ratio of the composite connection material exceeds 90%, a sufficient self-alignment function of the single-layer connection material is unavailable. Therefore, the endurance to the repeated stress deteriorates if the ratio is lower than 10% or higher than 90%.

In most cases, the electronic component of the present invention is an electronic component including a semiconductor chip and another electronic component is a substrate, or the former is a substrate and the latter is an electronic component including a semiconductor chip. Such a combination of the electronic components can be used to obtain a mounting structure of a semiconductor device having endurance to the repeated thermal stress and a high connection reliability.

According to the present invention, a method is provided of mounting a semiconductor device on a substrate, the semiconductor device including, on an electrode, a composite connection material formed of a core and a conductor covering the core. The method includes the step of forming an auxiliary connection part in contact with the upper side of an electrode of the substrate, the auxiliary connection part being formed of a low melting-point conductor having a melting point of at most a melting point of the conductor covering the core, and the step of matching respective positions of the auxiliary connection part and the composite connection material to bring into contact the auxiliary connection part and the composite connection material, and heating to connect the auxiliary connection part and the composite connection material.

According to the method of mounting the semiconductor device with the composite connection material, the auxiliary connection part is first formed on the electrode of the substrate by using the low melting-point conductor. The auxiliary connection part is then melted in a mounting process so that the surface tension or the like of the connection part can provide the self-alignment function.

Preferably, according to the method of mounting a semiconductor device of the present invention, in the process of raising the temperature to heat and connect the auxiliary connection part and composite connection material, they are heated to melt the auxiliary connection part first and thereafter melt the conductor covering the core. In this way, the auxiliary connection part is melted at a temperature lower than the temperature at which any portion of the composite connection material is melted so that the self-alignment function can be obtained. Consequently, the semiconductor device is never mounted in a positionally deviated state and the endurance to the repeated stress can be enhanced.

According to the method of mounting a semiconductor device of the present invention, the auxiliary connection part may be formed of a low melting-point conductor in the state of paste for example. The auxiliary connection part can thus be formed readily on the electrode of the substrate. The low melting-point conductor of paste is melted at a lowest temperature in a mounting process to exercise the self-alignment function. Accordingly, it is possible to prevent the semiconductor device and substrate from being mounted in a positionally deviated state.

Preferably, according to the method of mounting a semiconductor device of the present invention, the low melting-point conductor is an alloy based on Sn for example. The Sn-based alloy can be used for the auxiliary connection part to allow itself to surely wet the conductor forming the surface layer of the composite connection material in a mounting process. In this way, the elastic body of the core is positioned appropriately for stress alleviation after the mounting process so that the endurance to the repeated stress can be improved.

Preferably, according to the method of mounting a semiconductor device of the present invention, the auxiliary connection part on the electrode of the substrate is greater in volume than the conductor of the composite connection material on the electrode of the semiconductor device.

Then, the amount of melted auxiliary connection part is enough to provide a satisfactory self-alignment function in a mounting process. Accordingly, the elastic body moves to a position appropriate for stress alleviation and connected there so that the mounting structure of the semiconductor device can be highly resistant to the repeated stress.

A method is provided of mounting a semiconductor device according to another aspect of the present invention, to mount, on a substrate, the semiconductor device having on an electrode a composite connection material formed of a core and a conductor covering the core. Preferably, the conductor covering the core is formed to have a thickness in a predetermined range so that the conductor melted in a mounting process is present between the core and an electrode of the substrate to prevent the core from contacting the electrode of the substrate.

Here, the thickness of the conductor covering the core is explained. For a CSP of 0.8 mm pitch, a conventional resin ball and a resin core therein are respectively 440 µm and 413 µm in diameter, which means that the half of the difference of 27 µm therebetween, namely 13.5 µm corresponds to the average thickness of the conductor. In usual, the mounting process employs solder paste. When solder corresponding in volume to the solder paste is added to the resin ball, the diameter of the resin ball becomes approximately 530 µm and thus there is a diameter increase of 90 µm compared with the diameter of the resin ball only. If the thickness of the conductor is further increased, a problem could occur in terms of contact between resin balls adjacent to each other. For the CSP of 0.8 mm pitch, the distance between respective centers of adjacent resin balls is 800 µm and the diameter of the resin ball is 440 µm and thus a margin of 360 µm is left therebetween for avoiding contact of these balls. If the diameter of the resin ball is 800 µm, resin balls adjacent to each other contact. If the diameter of the resin ball is 750 µm, solder is melted to increase the width thereof due to the own weight of the device. Then it is highly possible that the solder is brought into contact with an adjacent solder. In view of this, the thickness of the conductor of the resin ball may be in the range from approximately 40 µm to 150 µm, for the 0.8 mm CSP so as to prevent contact between solders adjacent to each other and connect the semiconductor device and substrate in a self-aligned manner without contact of the core with the electrode. Therefore, the predetermined range of the thickness of the conductor covering the core is preferably from approximately 40 µm to 150 µm.

According to the mounting method, without auxiliary connection part provided to the substrate, the self-alignment function is available from the surface tension of the sufficient amount of melted conductor even if respective positions of the semiconductor device and substrate do not match to some extent. Consequently, an allowable positional deviation between the semiconductor device and substrate increases and a highly reliable mounting structure of the semiconductor device is achieved.

According to a first aspect of a mounting structure for mounting a semiconductor device of the present invention, the semiconductor device is connected to a substrate via a plurality of connection materials. The connection materials are constituted of a first type of connection material formed of a core and a conductor covering the core and a second type of connection material formed of a conductor.

In a process of forming the mounting structure, even if respective electrodes of the semiconductor device and substrate are not aligned, the self-alignment function chiefly of the conductor of the single-layer connection material allows electrodes of the semiconductor device to be arranged accurately on electrodes of the substrate. For the composite connection material, the a low modulus of elasticity or the like of the core can appropriately be selected to alleviate stress concentration and prevent cracks by providing the composite connection material in an area where the stress concentrates, for example. It is thus necessary that the a low modulus of elasticity or the like of the core in an appropriate range is selected to allow the composite connection material to be placed in such an area in order to alleviate stress concentration.

According to a second aspect of the mounting structure for mounting a semiconductor device of the present invention, the semiconductor device is connected to a substrate via a composite connection material formed of a core and a conductor covering the core. The connection material has a substrate contact portion contacting the substrate and an electrode contact portion contacting an electrode of the semiconductor device, and melting point of the substrate contact portion is lower than that of the electrode contact portion.

In a mounting process, the conductor of the lower melting point is melted on the electrode of the substrate to provide the self-alignment function available from the surface tension or the like. Then, electrodes of the semiconductor device can appropriately be corrected in position. As a result, the semiconductor device and substrate can be mounted without positional deviation and the endurance to the repeated stress can be enhanced.

According to another aspect of the mounting structure for mounting a semiconductor device of the present invention, the semiconductor device is connected to a substrate via a composite connection material formed of a core and a conductor covering the core. Preferably, the conductor of a thickness in a predetermined range is present between the core and an electrode of the substrate. Accordingly, it never occurs that the core and the electrode of the substrate contact each other in a mounting process. Further, the self-alignment function of the conductor in a melted state can be obtained. The predetermined range of the thickness of the conductor between the core and the substrate electrode may be any which allows the melted conductor to provide the core and the semiconductor device with buoyancy and accordingly prevent the core from contacting the substrate electrode. As described above, the predetermined thickness range of the conductor can be achieved by using a composite connection material including a conductor covering a core and having a thickness in the range from approximately 40 μm to 150 μm.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in conjunction with the drawings.

First Embodiment

Figure 1:
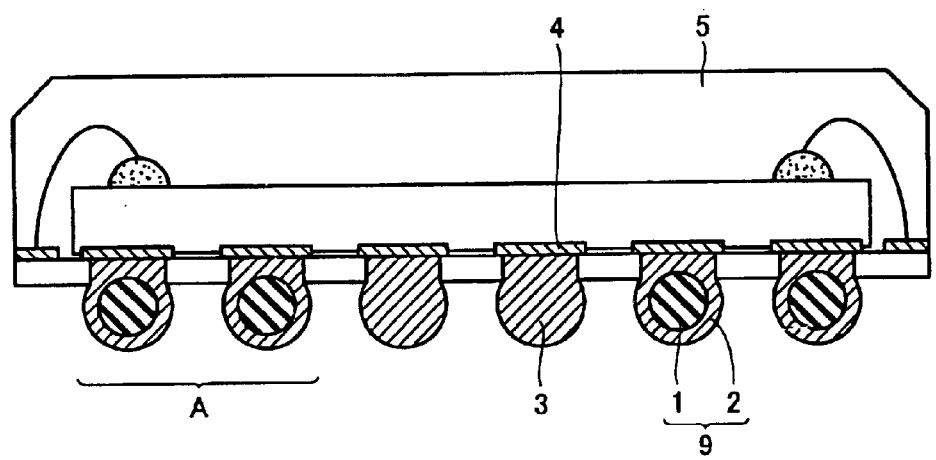
FIG. 1 is a cross sectional view of a semiconductor device according to a first embodiment of the present invention.

Referring to FIG. 1, electrode pads are provided on one side of a semiconductor device 5. On these electrode pads, single-layer connection materials 3 and composite connection materials 9 each formed of a core 1 and a conductor 2 covering core 1 are arranged. In an electrode region where electrodes 4 are provided, composite connection materials 9 are arranged in an outer area (A) inside and along the perimeter of the electrode region while single-layer connection materials 3 are arranged in an inner area in the electrode region. Single-layer connection materials 3 thus arranged have a greater amount of conductors melted in a mounting process and accordingly a self-alignment function thereof can be expected. Single-layer connection materials 3 can thus be arranged in the inner area in the electrode region to achieve mounting with an accurate alignment. In addition, it is possible to prevent any crack from occurring by providing highly-deformable composite connection materials 9 in the outer area in the electrode region where a repeated stress could concentrate.

Figure 2:
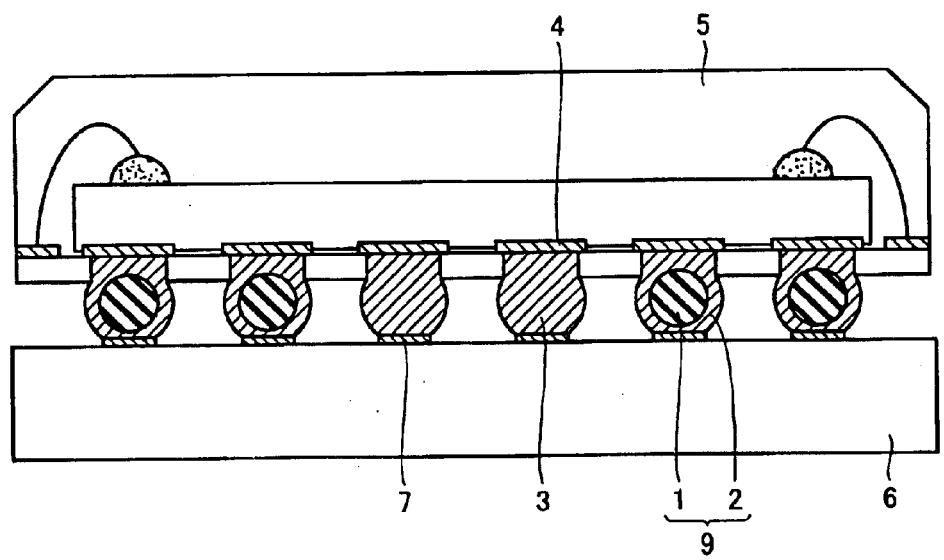
FIG. 2 is a cross sectional view of the semiconductor device in FIG. 1 mounted on a substrate.

A method of mounting a semiconductor device on a substrate or the like is described, the semiconductor device being connected accurately to electrodes of the substrate. FIG. 2 is a cross sectional view of a mounting structure in which the semiconductor device shown in FIG. 1 is connected to the substrate. Referring to FIG. 2, electrodes 4 of semiconductor device 5 and electrodes 7 of substrate 6 are coupled by means of single-layer connection materials 3 and composite connection materials 9. Composite connection materials 9 each including core 1 as shown in the cross section are resistant enough to the stress repeatedly and concentratedly exerted after mounting, and accordingly, composite connection materials 9 are arranged in outer area A where the stress concentrates. The main component of the composite connection material is the core which is an elastic body. Then, the diameter of core 1 considerably influences the height of the connection material. In addition, it is known that a greater height of the connection material can alleviate the influence of thermal strain after mounting. It is thus required to make the size of the core greater than a predetermined size.

The self-alignment function is explained below in more detail. Single-layer connection materials (bumps) 3 arranged in the inner area in the electrode region of the semiconductor device melt in a mounting process to serve the self-alignment function. Accordingly, nuclei 1 covered with melted conductor in composite connection materials 9 move to respective positions appropriate for stress alleviation after mounting. If all of the connection materials are composite connection materials, an undesirable state occurs as described below. Suppose here that nuclei 1 of composite connection materials 9 are each a resin ball with a low modulus of elasticity and the resin ball is covered with a conductor, which is Sn—Pb alloy. When semiconductor device 5 having these connection materials is connected to substrate 6, the smaller amount of conductor, Sn—Pb, covering resin balls 1 results in an insufficient self-alignment function. Then, resin balls do not move to respective positions suitable for alleviating stress after mounting and accordingly, resin balls are connected as they are in the positionally deviated state.

On the other hand, if connection materials of the semiconductor device are partially constituted of single-layer connection materials 3 formed of Sn—Pb solder balls, for example, the Sn—Pb solder balls melt in a mounting process to perform the self-alignment function. Accordingly, composite connection materials 9 move to appropriate positions. Naturally, resin balls 1 also move to respective positions appropriate for alleviating stress after mounting. As single-layer connection materials 3 are formed of Sn—Pb solder balls, which are likely to creep, for example, the stress exerted on the semiconductor mounting structure after mounting can be alleviated to enhance the connection reliability. Instead of the Sn—Pb solder balls, solder balls like Pb-free solder based on Sn and containing Bi or the like may be used. The Pb-free solder containing Bi or the like has a high a low modulus of elasticity so that the connecting portion of the semiconductor mounting structure can be reinforced.

Figure 3A:
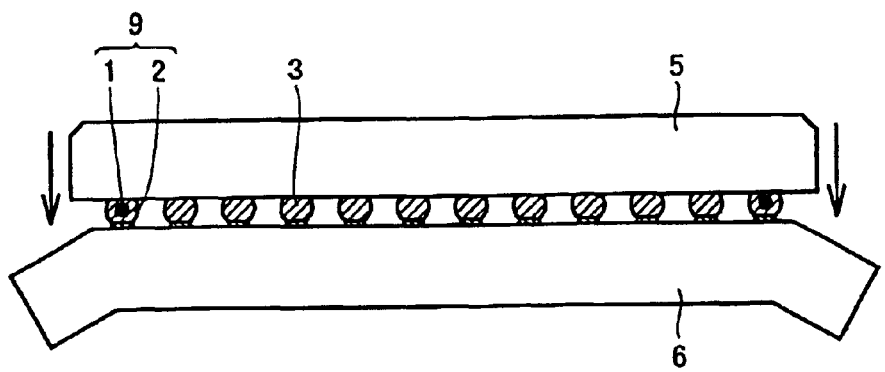
FIG. 3A is a cross sectional view of a semiconductor device mounted on a substrate with composite connection materials arranged in an outer row of area-arrayed electrodes.
Figure 3B:
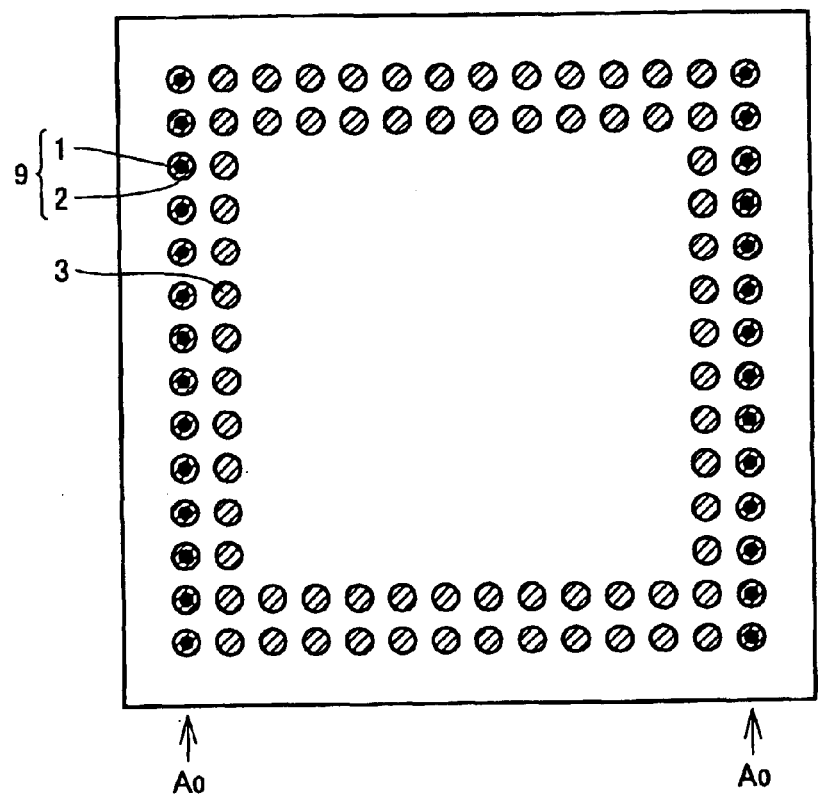
FIG. 3B is a plan view of the semiconductor device in FIG. 3A with the connection materials arranged.

In a mounting structure of a semiconductor device having single-layer connection materials 3 and composite connection materials 9 arranged in an area-array form, if a bending load is applied to the mounting structure for example, most of the load is applied to connection materials in outer rows. As shown in FIGS. 3A and 3B, composite connection materials 9 can be arranged in outer rows $A_o$ of the area array to allow the entire mounting structure to endure the bending load. When the bending load is exerted, the semiconductor device with a semiconductor chip has a high a low modulus of elasticity and thus the semiconductor device is resistant to the bending. Consequently, only the substrate deforms to cause a state close to peeling. Then, an excessive force is exerted on the outside of the mounting structure of the semiconductor device. For connection materials between the semiconductor device and the substrate, upper pads (electrodes) and lower pads (electrodes) are separated from each other so that the state of stress is like the tensile stress state. Then, elastic bodies with a low modulus of elasticity such as resin balls are included in the connection materials to alleviate the stress on the connecting portion by means of the resin balls. The mounting structure can thus resist bending.

Figure 4A:
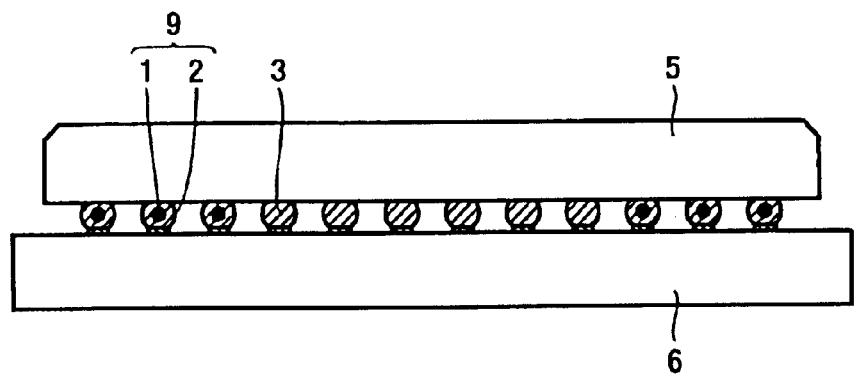
FIG. 4A is a cross sectional view of a semiconductor device mounted on a substrate with composite connection materials arranged at corners of a region where area-arrayed electrodes are provided.
Figure 4B:
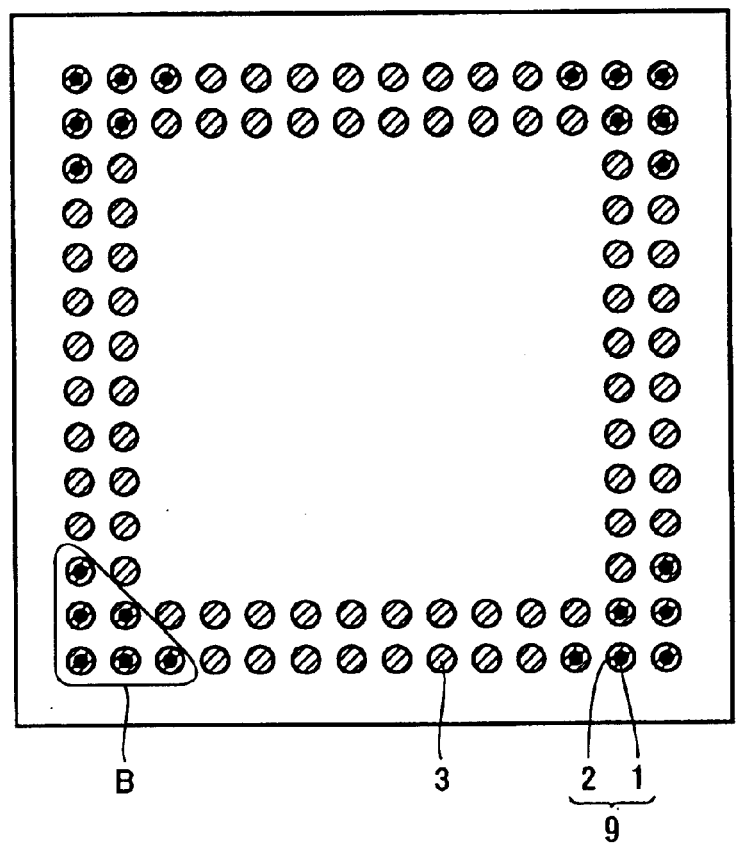
FIG. 4B is a plan view of the semiconductor device in FIG. 4A with the connection materials arranged.

When a heat cycle test is conducted, a distortion with characteristics as described below occurs in the connecting portion of the mounting structure of the semiconductor device. Specifically, when there is no distortion in the central part of the semiconductor device, the greatest distortion of the connecting portion occurs near corners furthermost from the center. As shown in FIGS. 4A and 4B, composite connection materials 9 can be arranged at corners B to alleviate any stress exerted on the connecting portion after mounting.

According to the embodiment above, the composite connection materials are arranged at locations where the distortion is most likely to occur. Then, a mounting structure of a semiconductor device can be achieved capable of preventing cracks from occurring, ensuring connection reliability and resistant to the repeated stress.

In order to strengthen the connecting portion in the mounting structure of the semiconductor device, approximately 10% or higher of connection materials can be composite connection materials on the area array so that the strength of the connecting portion is increased. On the other hand, approximately 10% or higher of connection materials can be single-layer connection materials on the area array so that a sufficient self-alignment function can be ensured. For example, for 08CSP48, five composite connection materials corresponding in number to 10% of the entire connection materials (bumps) are used, one composite connection material at each corner, and remaining connection materials are single-layer connection materials. In this way, the self-alignment function of the single-layer connection materials can be utilized for connection with an accurate alignment. In addition, the composite connection materials arranged at corners provide endurance to the repeated stress after mounting. Alternatively, the ratio between the composite connection materials and single-layer connection materials can be reversed. Specifically, five single-layer connection materials corresponding in number to 10% of the entire connection materials are used, the five single-layer connection materials arranged on the central part of the area array, in order to achieve a similar advantage. In other words, the self-alignment function chiefly of the single-layer connection materials can be utilized for connection with an accurate alignment, and the repeated stress after mounting can be addressed by the outer composite connection materials to prevent cracks from occurring.

First to fourth methods are described below of manufacturing a semiconductor device with connection materials constituted of single-layer and composite connection materials.

First Manufacturing Method of the Present Invention

Figure 5A:
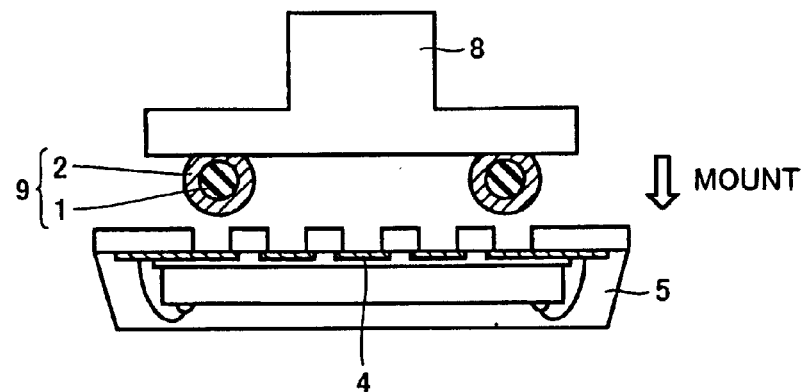
FIGS. 5A–5C illustrate a first manufacturing method of the present invention to form connection materials, FIG. 5A showing composite connection materials in cross section to be mounted on electrodes of a semiconductor device, FIG. 5B showing single-layer connection materials in cross section that are thereafter mounted on electrodes of the semiconductor device, and FIG. 5C showing connection materials in cross section thereafter heated to be melted.
Figure 5B:
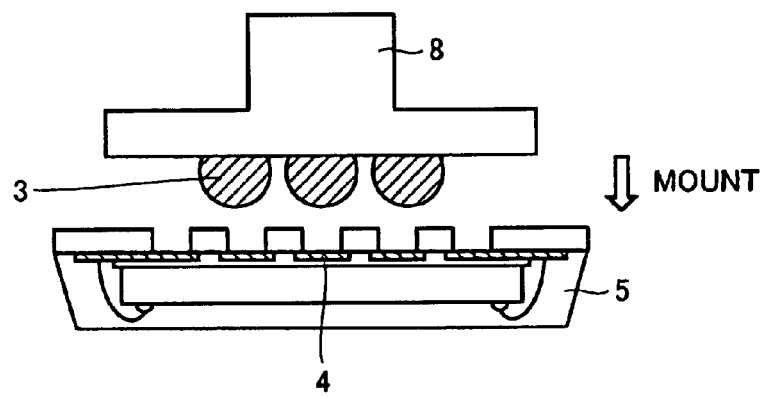
Figure 5C:
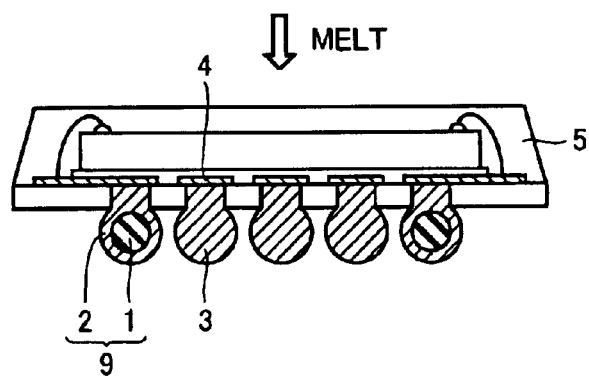

By means of a solder ball mounting apparatus 8 for example, composite solder balls 9 which are composite connection materials as well as solder balls 3 which are single-layer connection materials 3 are mounted on electrodes 4 of a semiconductor device 5 (FIGS. 5A and 5B). Then, as shown in FIG. 5C, these balls are melted to form external electrodes (connection materials) shown in FIG. 1. The solder balls may be mounted by transferring solder paste or flux to solder balls to be mounted (transfer method) or by simply sucking solder balls by ball heads to mount the solder balls.

Second Manufacturing Method of the Present Invention

Figure 6A:
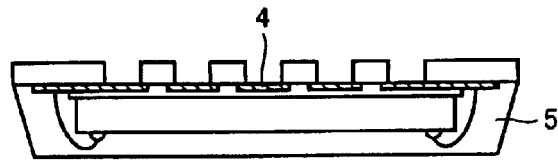
FIGS. 6A–6D illustrate a second manufacturing method of the present invention to form connection materials, FIG. 6A showing a semiconductor device in cross section before connection materials are formed, FIG. 6B showing in cross section a solder paste underlying the connection materials that is applied by printing or by a dispenser, FIG. 6C showing in cross section connection materials to be mounted on the underlying paste, and FIG. 6D showing connection materials in cross section that are heated to be melted.
Figure 6B:
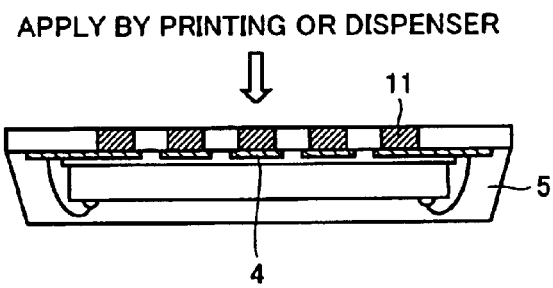
Figure 6C:
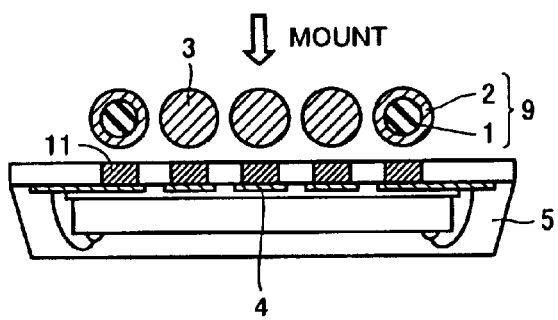
Figure 6D:
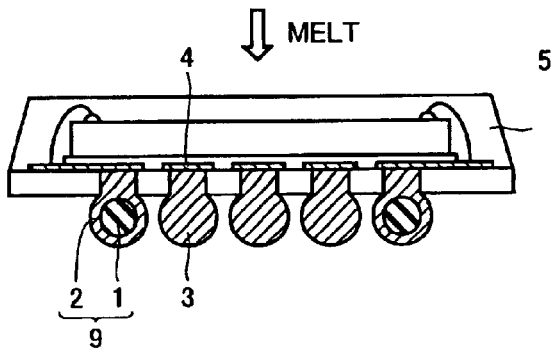

Solder paste 11 is applied to electrodes 4 of a semiconductor device 5 shown in FIG. 6A by printing or by means of a dispenser (FIG. 6B). A metal film (not shown) is vapor-deposited thereon to a thickness of several µm. Then, as shown in FIG. 6C, a predetermined number of plated resin balls corresponding to composite connection materials 9 and a predetermined number of solder balls corresponding to single-layer connection materials 3 and having the same size as that of the resin balls are mounted. As shown in FIG. 6D, these balls are thereafter heated to melt and accordingly form external electrodes (connection materials) shown in FIG. 1. The metal film may be vapor-deposited by sputtering or the like. The metal may be any which allows itself to wet a metal such as Al, TiW, Au, and Ni.

Third Manufacturing Method of the Present Invention

Figure 7A:
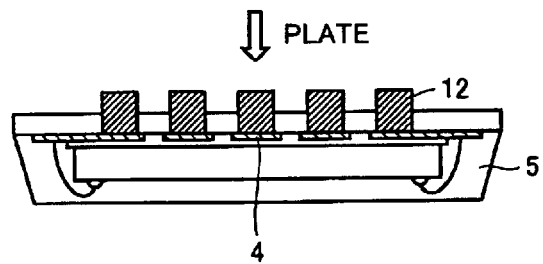
FIGS. 7A–7D illustrate a third manufacturing method of the present invention to form connection materials, FIG. 7A showing an underlayer in cross section that is formed by plating, FIG. 7B showing connection materials in cross section that are formed on the underlayer, FIG. 7C showing the connection materials in cross section with conductors thereof heated to be melted, and FIG. 7D showing a semiconductor device in cross section placed on a substrate.
Figure 7B:
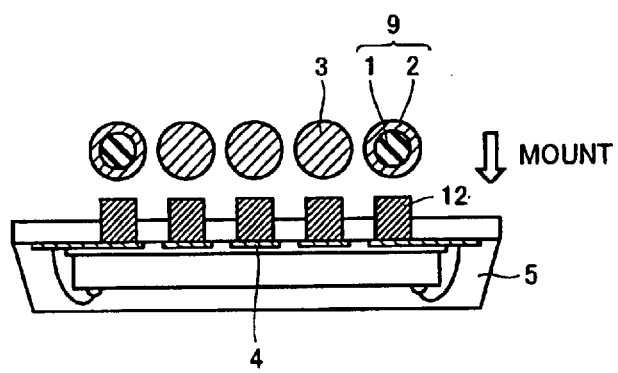
Figure 7C:
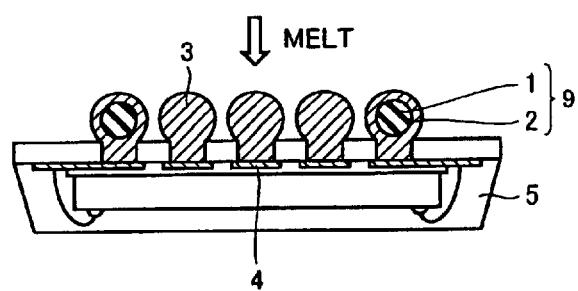
Figure 7D:
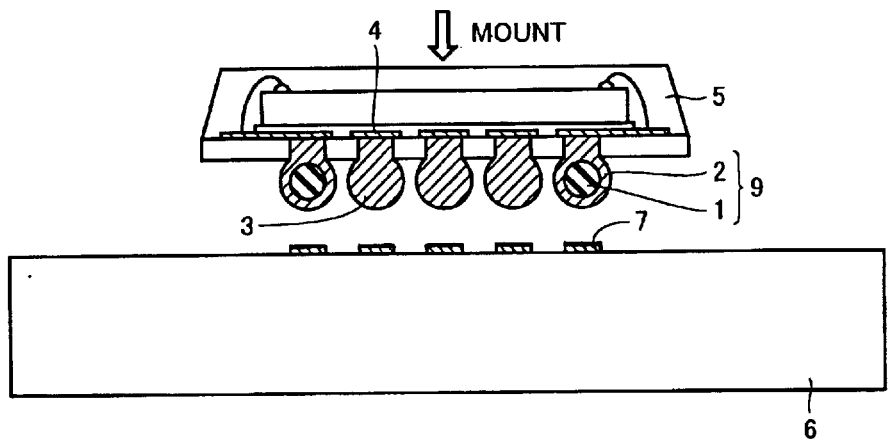

Referring to FIG. 7A, electrodes of a semiconductor device are plated with solder, and a metal film (not shown) is vapor-deposited thereon to a thickness of several µm. Then, as shown in FIG. 7B, a predetermined number of plated resin balls corresponding to composite connection materials 9 as well as a predetermined number of solder balls corresponding to single-layer connection materials 3 and having the same size as that of the resin balls are mounted. As shown in FIG. 7C, resin and solder balls are heated to melt and accordingly form external electrodes (connection materials) shown in FIG. 1. As shown in FIG. 7D, external electrodes of the semiconductor device are mounted on a substrate 6 for mounting the semiconductor device.

Fourth Manufacturing Method of the Present Invention

Figure 8A:
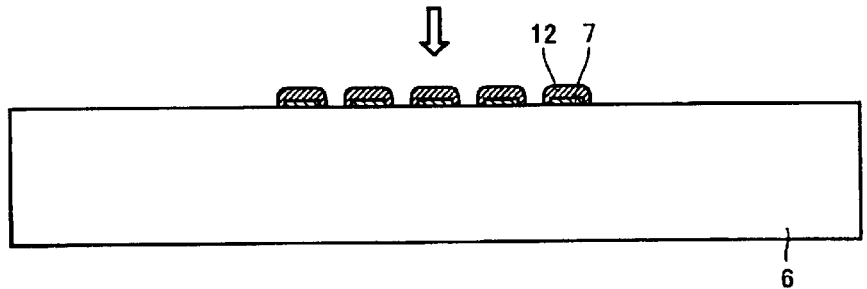
FIGS. 8A–8D illustrate a fourth manufacturing method of the present invention to form connection materials, FIG. 8A showing auxiliary connection parts in cross section that are formed on electrodes of a substrate, FIG. 8B showing connection materials in cross section that are arranged on the auxiliary connection parts, FIG. 8C showing the connection materials in cross section with conductors thereof that are heated to be melted, and FIG. 8D showing a semiconductor device in cross section mounted on a substrate with the connection materials.
Figure 8B:
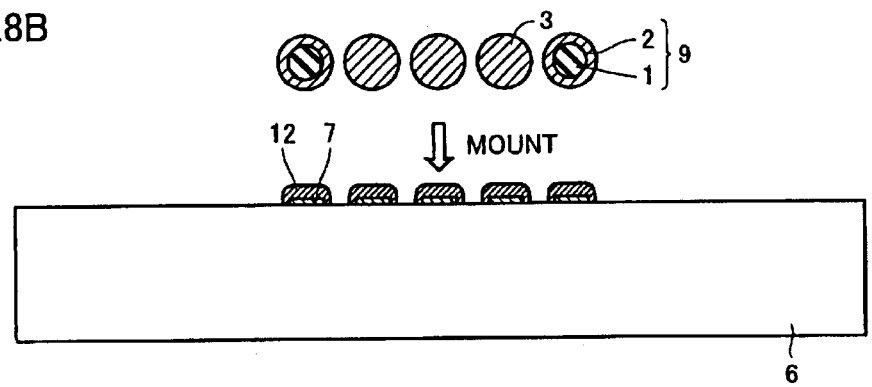
Figure 8C:
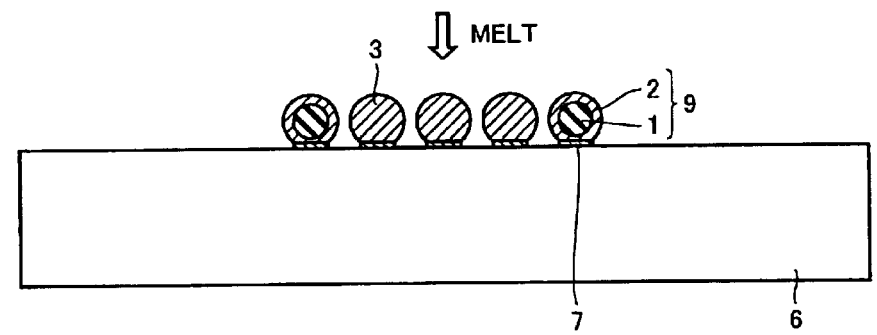
Figure 8D:
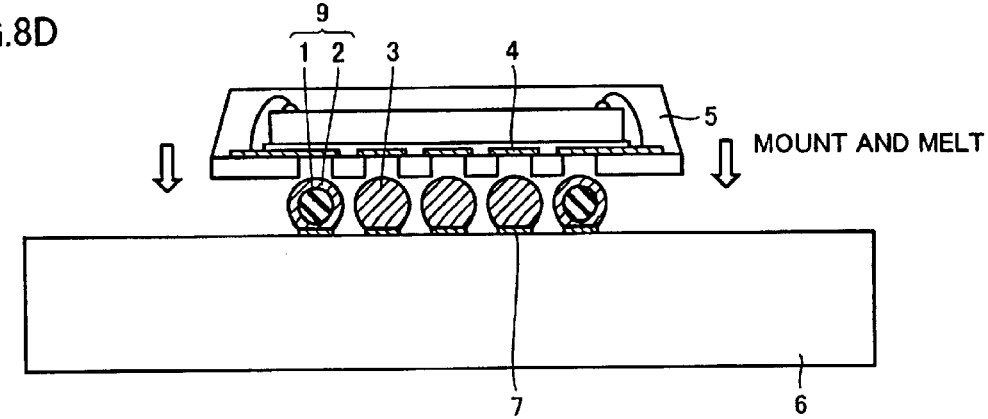

Referring to FIG. 8A, solder paste is applied to electrodes 7 of a substrate 6 by printing or by means of a dispenser to form auxiliary connection parts 12 (FIG. 8B). On the metal film, a predetermined number of resin balls corresponding to composite connection materials 9 as well as a predetermined number of solder balls corresponding to single-layer connection materials 3 and having the same size as that of the resin balls are mounted. After this, they are heated to melt as shown in FIG. 8C. Then, as shown in FIG. 8D, a semiconductor device 5 is mounted on and connected to the substrate.

The semiconductor device manufactured according to the first to fourth methods of the present invention as described above is mounted on a substrate, heating and melting processes are carried out, and thus the mounting structure as shown in FIG. 2 is completed.

Second Embodiment

Figure 9:
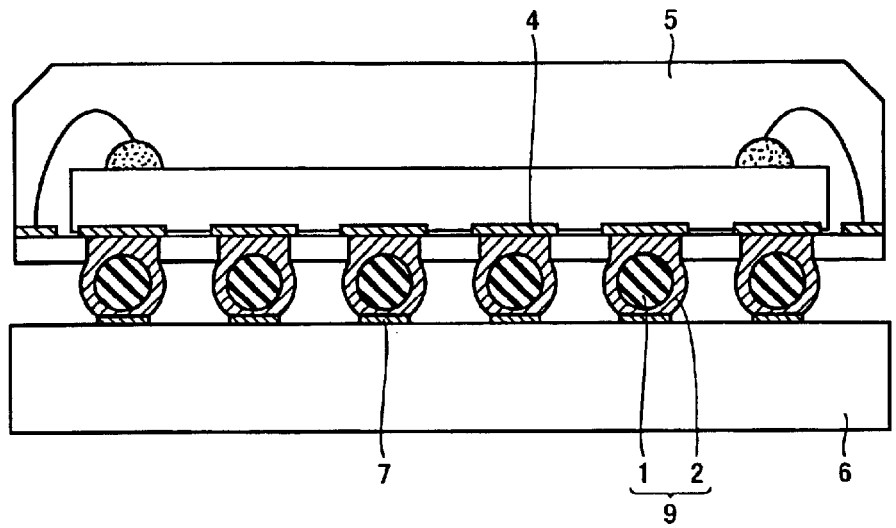
FIG. 9 is a cross sectional view of a mounting structure of a semiconductor device formed through a method of mounting a semiconductor device according to a second embodiment of the present invention.

FIG. 9 is a cross sectional view of a mounting structure after a semiconductor device is mounted by a method according to a second embodiment of the present invention. According to the second embodiment, all connection materials constituting external electrodes are composite connection materials 9, and accurate positional matching between electrodes 4 of a semiconductor device 5 and electrodes 7 of a substrate 6 is achieved by the self-alignment function by using the mounting method as detailed below.

Figure 10A:
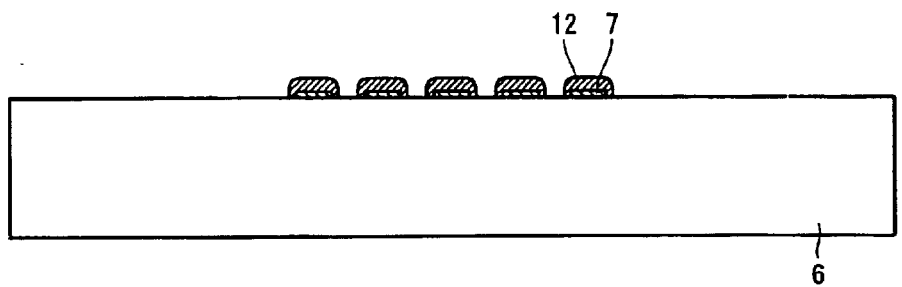
FIGS. 10A and 10B illustrate a method of mounting a semiconductor device, FIG. 10A showing in cross section auxiliary connection parts formed on electrodes of a substrate and FIG. 10B showing in cross section the semiconductor device to be mounted on the substrate.
Figure 10B:
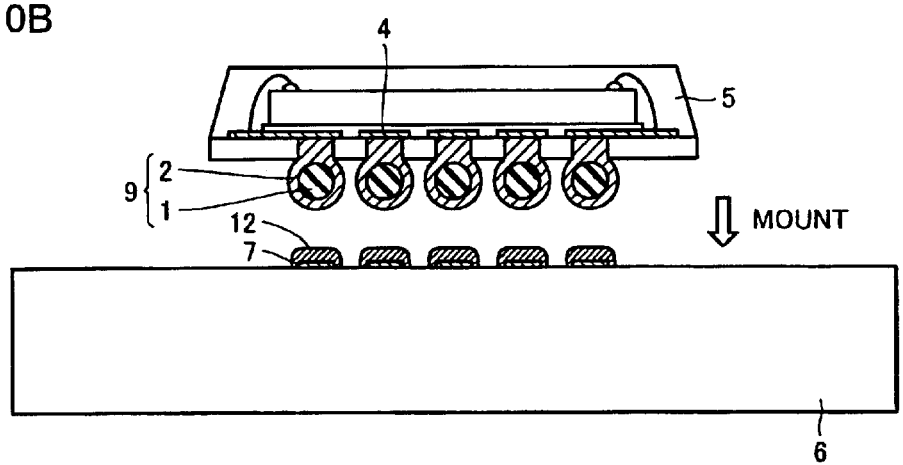

Referring to FIGS. 10A and 10B, according to the second embodiment, auxiliary connection parts 12 made of conductor with a low melting-point are formed in advance on electrodes 7 of substrate 6. Auxiliary connection parts 12 are heated for melting them in a mounting process, so that the surface tension of the melted connection parts provides the self-alignment function. The low melting-point conductor forming auxiliary connection parts 12 may be of paste or may be formed by plating of a land portion. When electrodes 4 of semiconductor device 5 and electrodes 7 of substrate 6 are connected, auxiliary connection parts 12 and conductors 2 of connection materials wet each other. At this time, the self-alignment function is exerted, connection is made, and electrical conduction is accordingly ensured.

Figure 11:
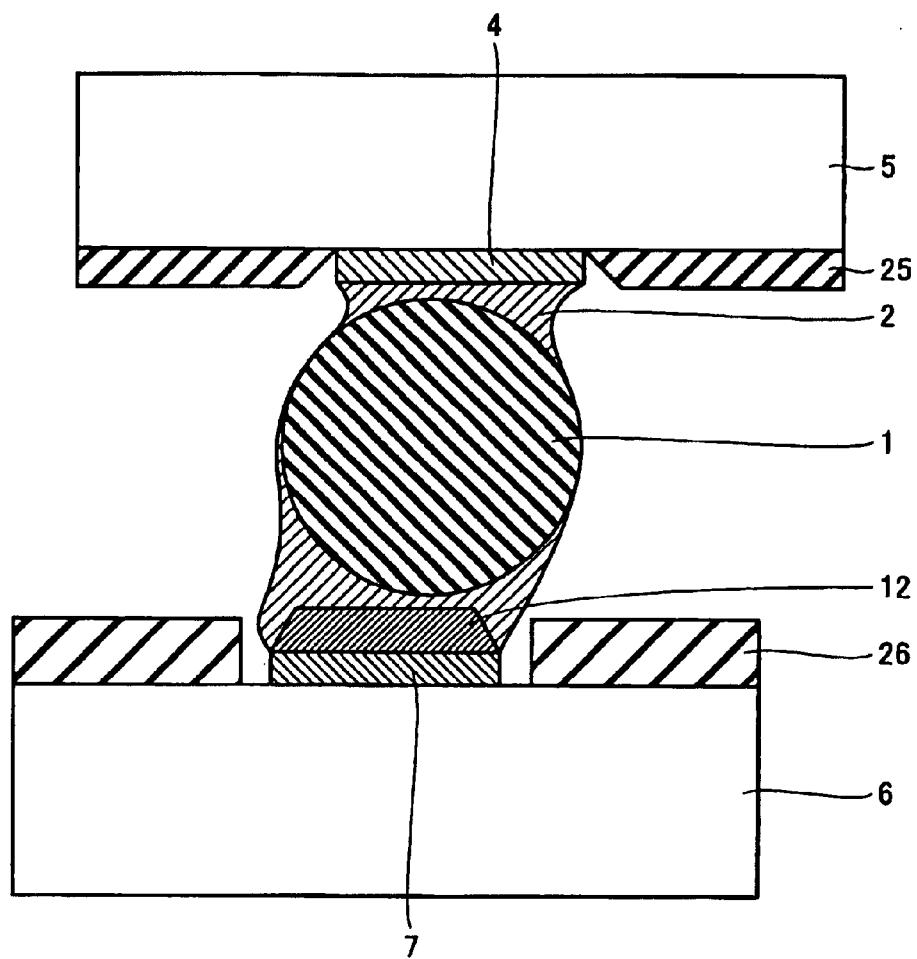
FIG. 11 illustrates a thin part of a conductor of a composite connection material, the thin part being caused when an auxiliary connection part is not melted at a temperature lower than that of the conductor of the composite connection material so that the self-alignment function is not obtained even with the melted conductor of the composite connection material.

When the temperature is raised in the mounting process, the low melting-point conductor forming auxiliary connection parts 12 must be melted simultaneously with or earlier than melting of conductor 2 forming the surface layer of the composite connection material for a reason explained below. Specifically, if conductor 2 covering a core 1 of the composite connection material is melted earlier, melted conductor 2 wets and extends over auxiliary connection part 12 and electrode 7 of substrate 6 as shown in FIG. 11. Consequently, melted conductor 2 covering core 1 becomes partially thin. Even if auxiliary connection part 12 is thereafter melted to serve the self-alignment function, the non-uniform thickness of conductor 2 covering core 1 is not preferable in terms of the connection reliability. When the temperature is raised for mounting semiconductor device 5 on substrate 6, there is a temperature distribution of composite connection materials on electrodes of the semiconductor device. The melting point of the low melting-point conductor forming the auxiliary connection parts, at the time of melting of conductor 2 forming the surface layer of the composite connection materials, is set lower than the lowest temperature of the conductor of the composite connection materials, in order to obtain the self-alignment function. Referring to FIG. 11, it is noted that short circuit for example between electrodes of the semiconductor device is prevented by a protection film 25 and short circuit for example between electrodes of the substrate is prevented by a protection film 26.

Figure 12:
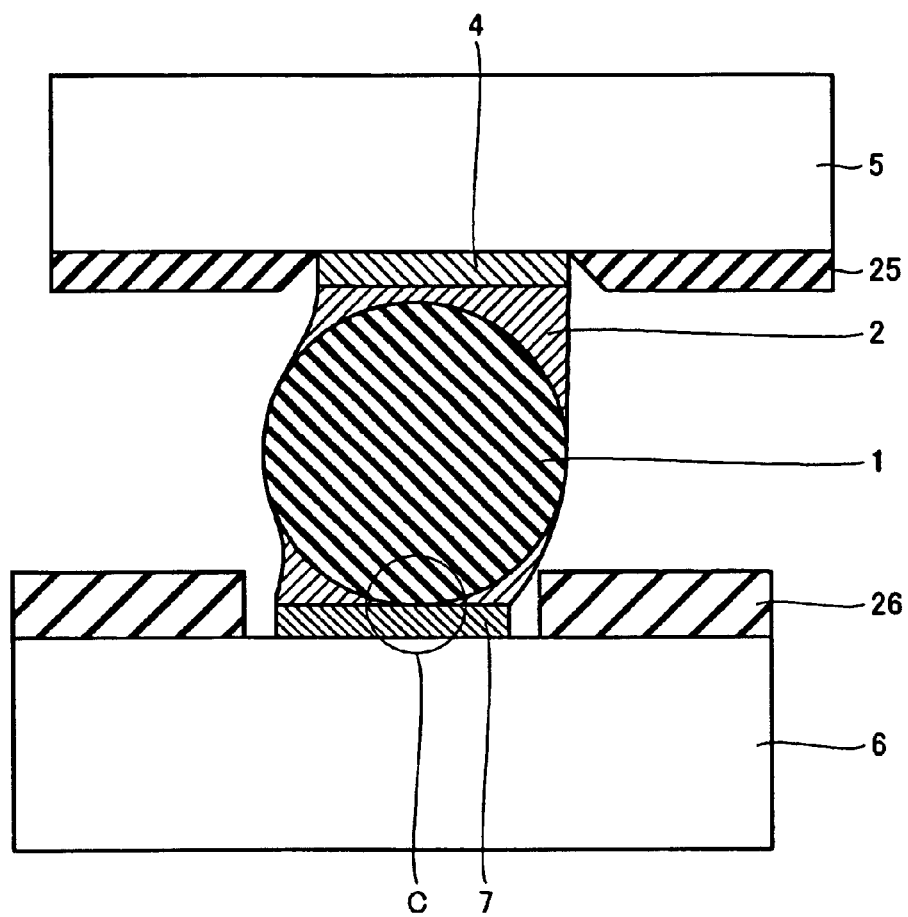
FIG. 12 illustrates that no self-alignment function is exercised when a connecting portion is constituted of a composite connection material only without auxiliary connection part and accordingly a core contacts an electrode of a substrate.
Figure 13:
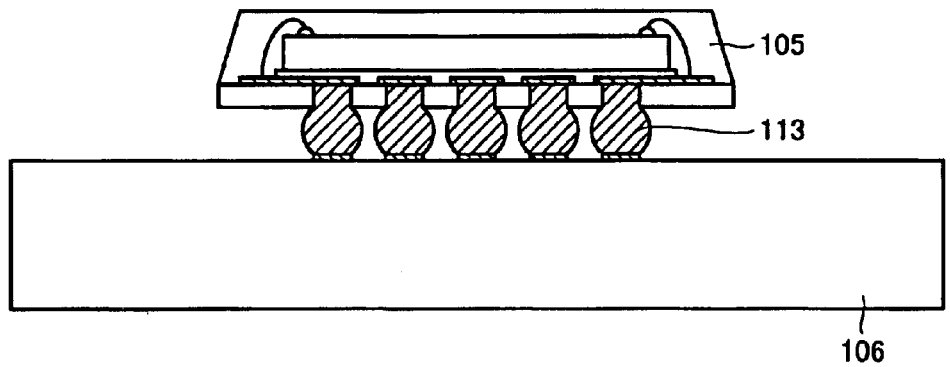
FIG. 13 is a cross sectional view of a conventional mounting structure of a semiconductor device.
Figure 14:
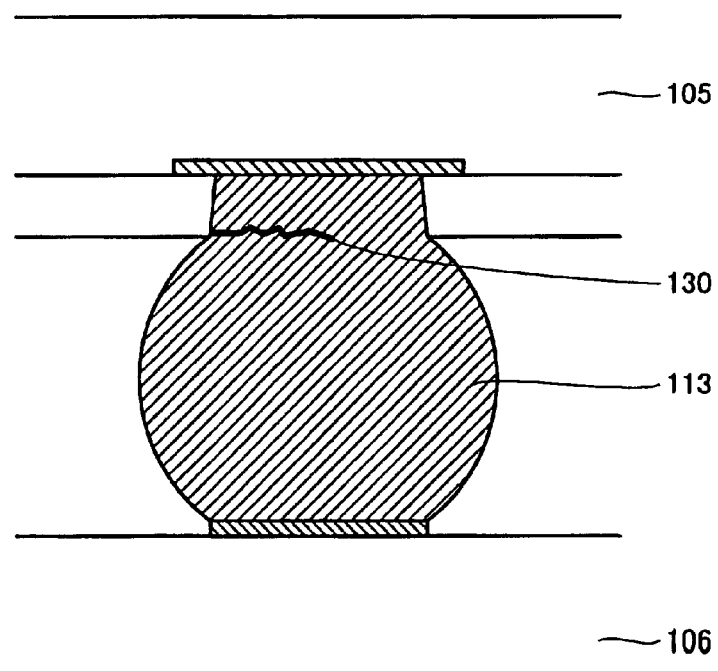
FIG. 14 is a cross sectional view of a conventional mounting structure of a semiconductor device to show a crack generated in a connection material on the semiconductor-device side.
Figure 15:
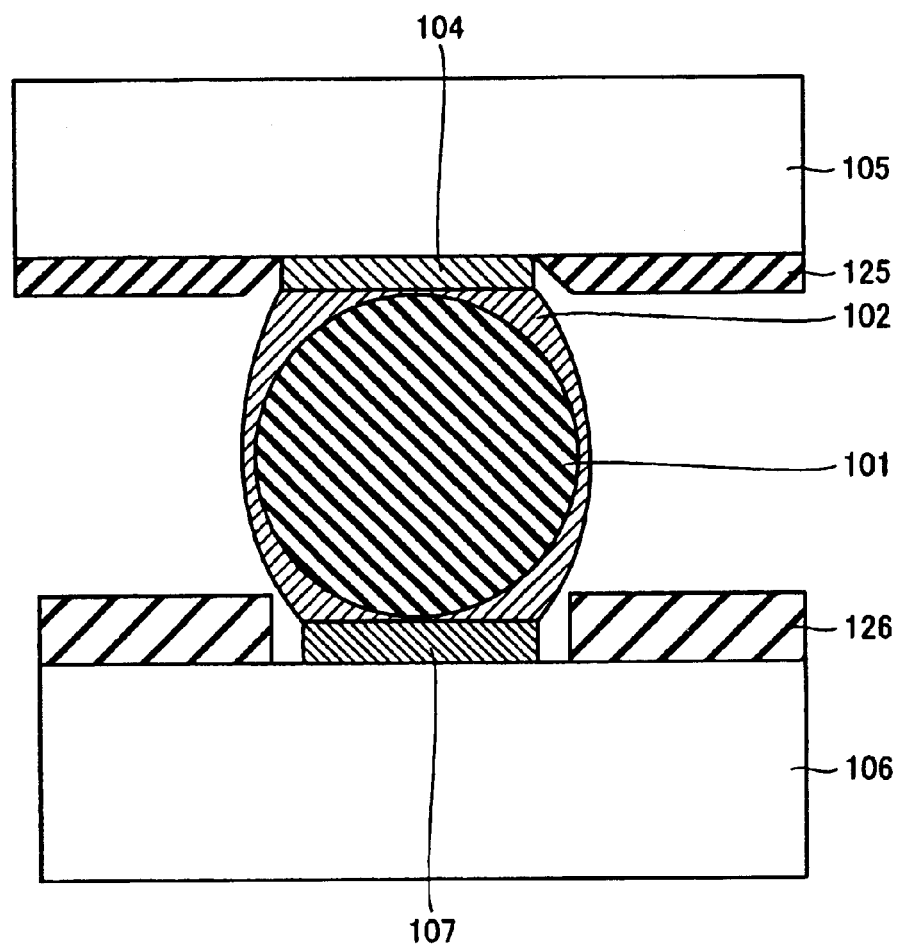
FIG. 15 is a cross sectional view of a conventional mounting structure of a semiconductor device using a composite connection material.
Figure 16:
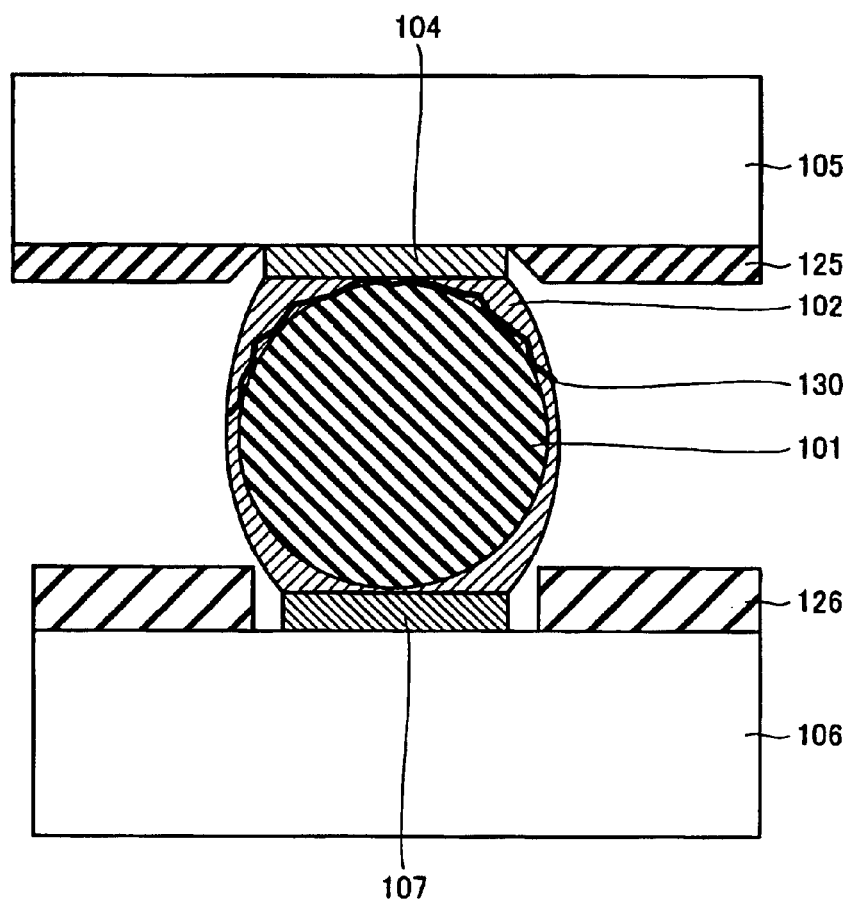
FIG. 16 is a cross sectional view of a conventional mounting structure of a semiconductor device using a composite connection material to show a crack generated therein.
Figure 17:
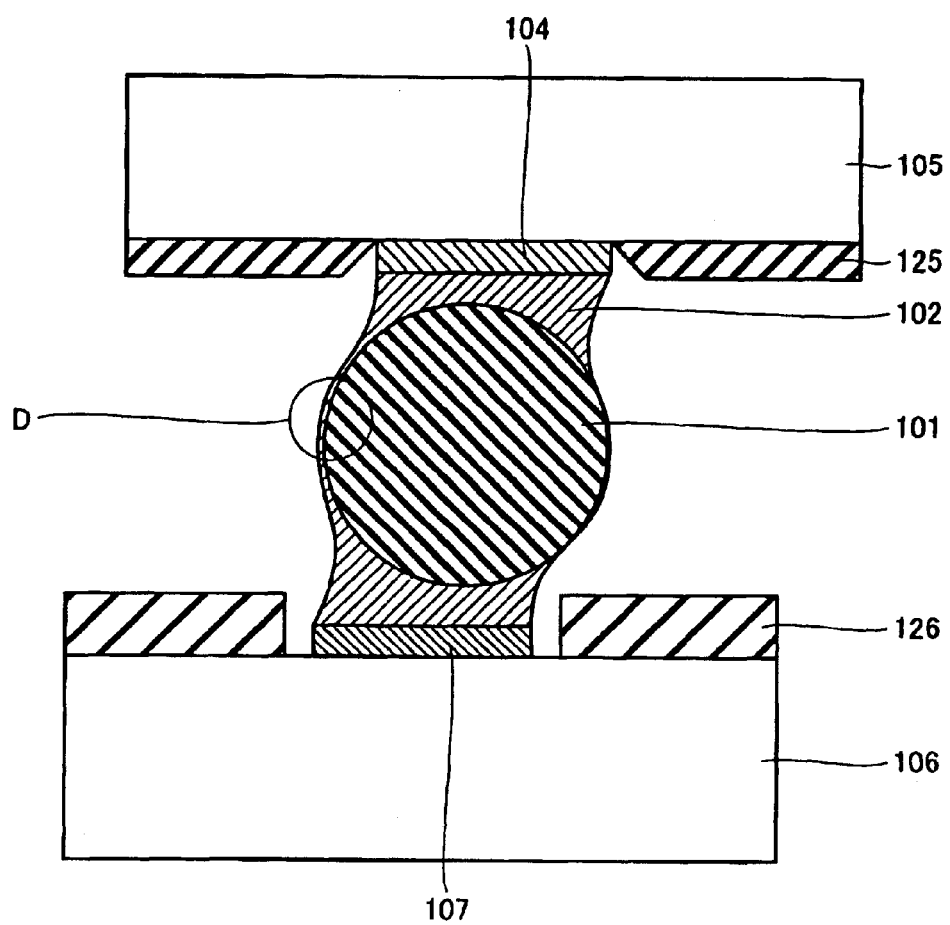
FIG. 17 is a cross sectional view of a conventional mounting structure of a semiconductor device using a composite connection material, where a conductor covering a core has a thinner part due to absence of self-alignment function in a mounting process.

In the mounting process, as auxiliary connection parts are provided, the melted auxiliary connection parts and conductor of the composite connection materials are present in the gap between the nuclei of the composite connection materials and the electrodes of the substrate. The surface tension of the melted auxiliary connection parts and conductor allows the nuclei to move to any position which makes it possible to alleviate stress. As shown in FIG. 12, when the own weights of the semiconductor device and nuclei cause nuclei to contact the substrate, the nuclei cannot move to the position providing the stress alleviation even by the surface tension and consequently, the conductor covering the nuclei becomes partially thin.

The auxiliary connection parts of solder paste for example may be formed by screen printing, by means of a dispenser, by plating or the like. Electroplating may be employed if a land portion (electrode of the substrate) is plated for forming the auxiliary connection part. For example, the auxiliary connection parts may be made of Pb-free solder based on Sn such as Sn—Ag—Cu. The self-alignment function can be exercised in the mounting process by forming the auxiliary connection parts made of such a conducting material. In addition, the nuclei in the composite connection materials serve to provide a mounting structure of a semiconductor device with a connecting portion which is strong and capable of alleviating stress. The thickness of the conductor of the composite connection materials can be increased so that the melted conductor in the mounting process can sufficiently wet the electrodes of the substrate.

When no auxiliary connection part is employed and the thickness of the conductor of the composite connection materials is increased, the conductor is melted through heating in the mounting process so that the melted conductor is present between the nuclei and electrodes of the substrate to serve the self-alignment function. Accordingly, the nuclei can move to any position which can provide the stress alleviation. As shown in FIG. 12, if the own weights of semiconductor device 5 and nuclei 1 cause nuclei 1 to contact the substrate (the region indicated by C in FIG. 12), the surface tension of melted conductor 2 causes the layer covering the nuclei to become partially thin and cannot allow the nuclei to move to the position which can provide the stress alleviation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mounting structure for mounting a semiconductor device, that is connected to a substrate via a composite connection material formed of a core, a conductor covering said core, and a single-layer connection material, wherein said composite connection material and said single-layer connection material have a substrate contact portion contacting said substrate and an electrode contact portion contacting an electrode of said semiconductor device, respectively, and melting point of said substrate contact portion are both lower than those of said electrode contact portions.

2. A method of mounting a semiconductor device on a substrate, comprising the steps of:

forming a composite connection member formed of a core and a conductor covering said core on a first electrode of said semiconductor device;

forming a single-layer connection member formed of a conductor on a second electrode of said semiconductor device;

forming an auxiliary connection part in contact with an upper side of one of the first electrode and the second electrode of said substrate, said auxiliary connection part being formed of a low melting-point conductor having a melting point of at most a melting point of said conductor covering said core; and matching respective positions of said auxiliary connection part and said composite connection material to bring into contact said auxiliary connection part and said composite connection material, and heating to connect said auxiliary connection part and said composite connection material.

3. The method of mounting a semiconductor device according to claim 2, wherein said auxiliary connection part on the electrode of said substrate is greater in volume than said conductor of said composite connection material on the electrode of said semiconductor device.

4. A mounting structure for mounting a semiconductor device, that is connected to a substrate via a plurality of connection materials, wherein said plurality of connection materials are constituted of a first type of connection material formed of a core and a conductor covering said core and a second type of connection material formed of a conductor.

* * * * *